United States Patent [19]

Gier

[11] 4,305,778
[45] Dec. 15, 1981

[54] HYDROTHERMAL PROCESS FOR GROWING A SINGLE CRYSTAL WITH AN AQUEOUS MINERALIZER

[75] Inventor: Thurman E. Gier, Chadds Ford, Pa.

[73] Assignee: E. I. Du Pont de Nemours and Company, Wilmington, Del.

[21] Appl. No.: 89,290

[22] Filed: Oct. 30, 1979

Related U.S. Application Data

[62] Division of Ser. No. 49,489, Jun. 18, 1979, abandoned.

[51] Int. Cl.$^3$ .......................... C30B 7/10; C30B 29/32
[52] U.S. Cl. ....................... 156/623 R; 156/DIG. 71; 156/DIG. 75; 156/DIG. 81; 423/305
[58] Field of Search ............... 156/DIG. 71, DIG. 75, 156/DIG. 81, 623 R; 106/47 R, 47 Q; 423/305; 422/253; 75/134 A, 135

[56] References Cited

U.S. PATENT DOCUMENTS

| | | | |
|---|---|---|---|
| 2,546,305 | 3/1951 | Jaffe et al. | 156/DIG. 71 |
| 3,231,400 | 1/1966 | Aagaard | 106/47 R |
| 3,759,683 | 9/1973 | Dislich | 106/47 R |
| 3,949,323 | 4/1976 | Bierlein et al. | 156/623 R |
| 4,019,950 | 4/1977 | Croxall et al. | 156/623 R |
| 4,231,838 | 11/1980 | Gier | 156/DIG. 75 |

FOREIGN PATENT DOCUMENTS

| | | | |
|---|---|---|---|
| 547800 | 10/1957 | Canada | 156/DIG. 75 |
| 4974 | 10/1979 | European Pat. Off. | 156/DIG. 75 |

OTHER PUBLICATIONS

Levin et al., "Phase Diagrams for Ceramists," Oct. 1964, Published by American Ceramic Society, pp. 87, 88, 96 and 160.

Zumsteg et al., "$K_xRb_{1-x}TiOPO_4$", Nov. 1976, Published in J. of Applied Physics, vol. 47, No. 11, pp. 4980–4985.

*Primary Examiner*—Gregory N. Clements

[57] ABSTRACT

Stable glass whose composition is defined by the quadrilaterals I II III IV of the accompanying ternary diagrams of FIGS. 1 and 2 for the system selected from the group consisting of $K_2O/P_2O_5/(TiO_2)_2$, $Rb_2O/P_2O_5/(TiO_2)_2$, $K_2O/As_2O_5/(TiO_2)_2$ and $Rb_2O/As_2O_5/(TiO_2)_2$; and the use of such glass in hydrothermal processes for producing crystals of $KTiOPO_4$ and certain crystal analogues thereof, namely, $RbTiOPO_4$, $KTiOAsO_4$ and $RbTiOAsO_4$.

8 Claims, 2 Drawing Figures

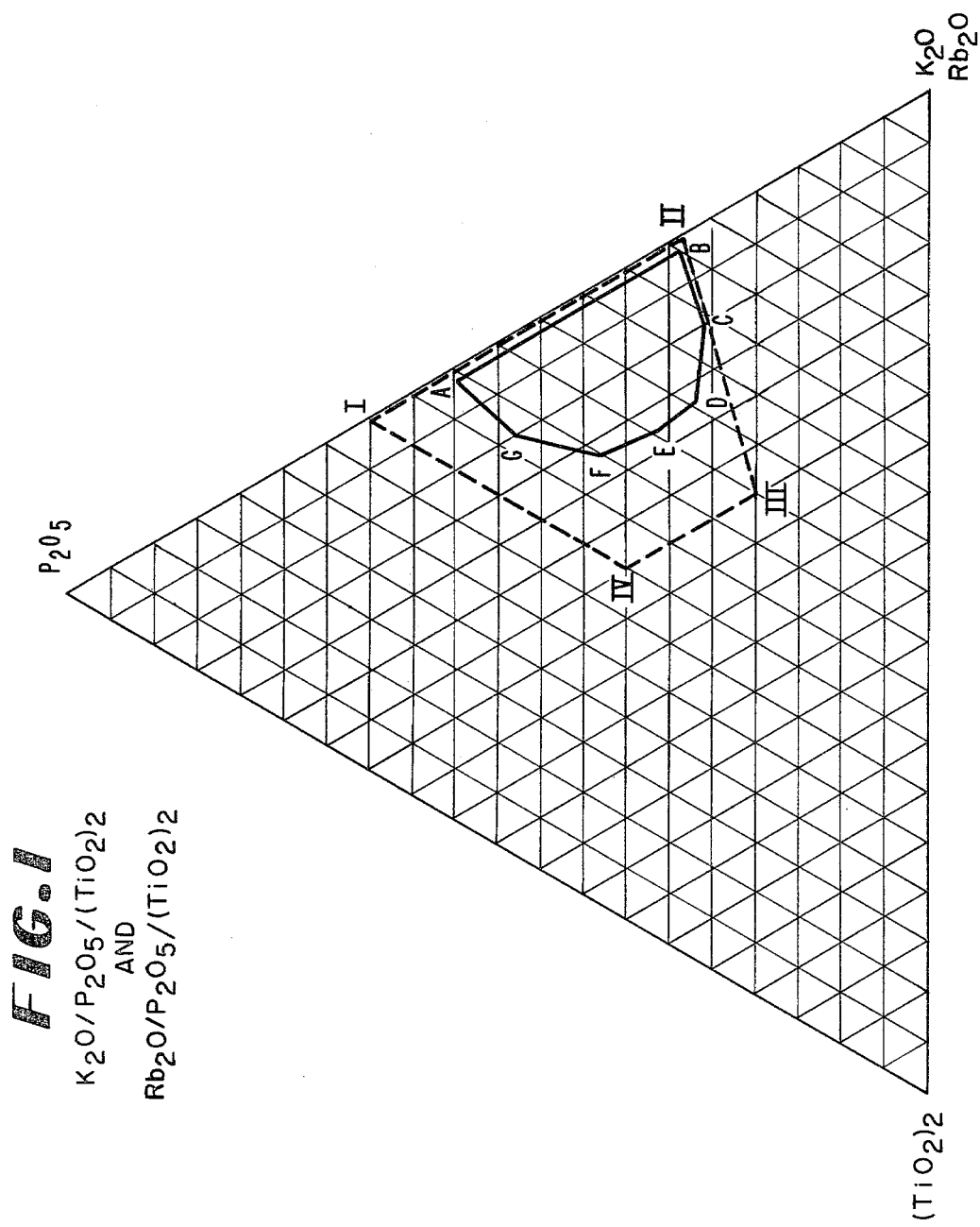

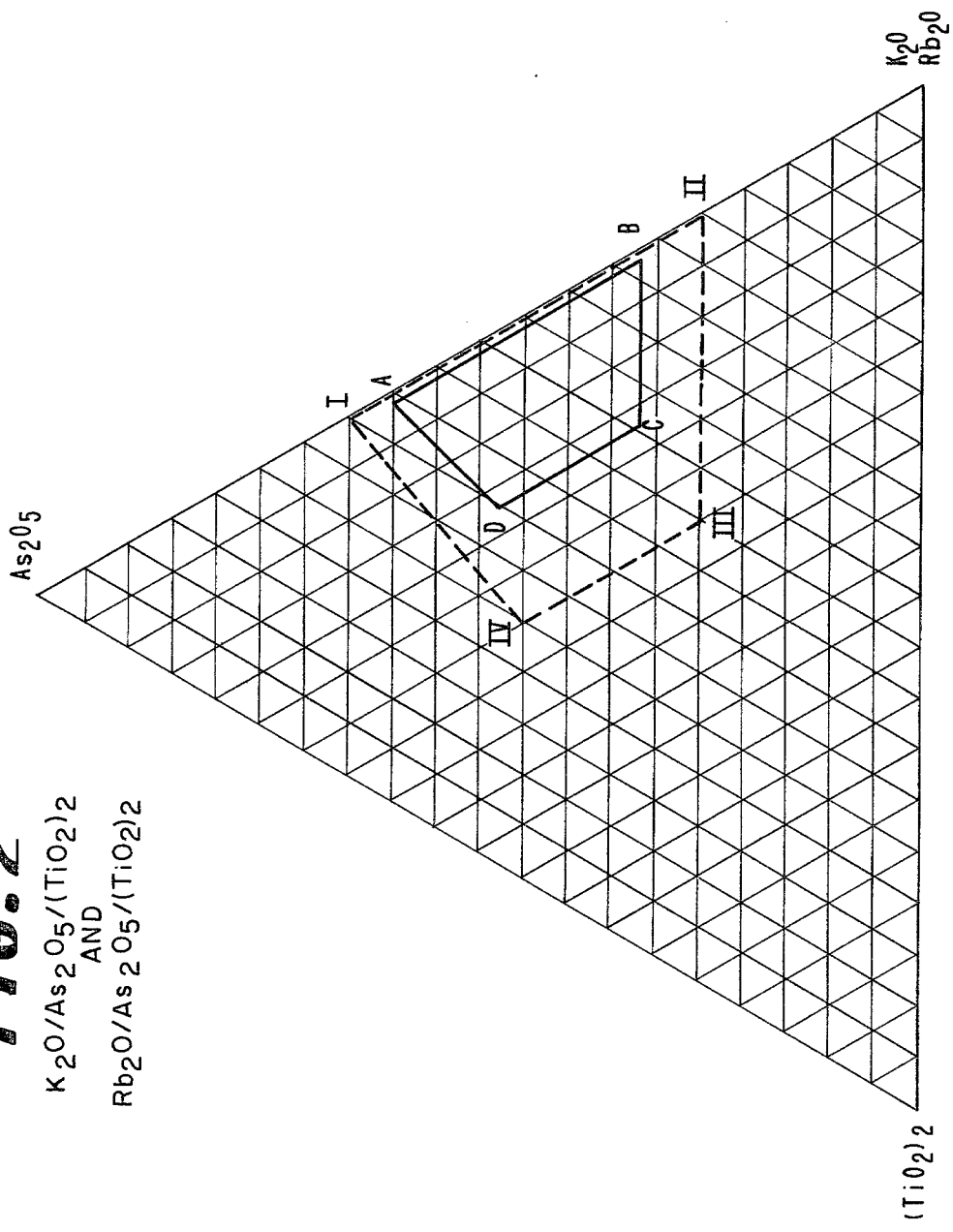

HYDROTHERMAL PROCESS FOR GROWING A SINGLE CRYSTAL WITH AN AQUEOUS MINERALIZER

This is a division, of application Ser. No. 049,489, filed June 18, 1979 and expressly abandoned Dec. 17, 1979.

TECHNICAL FIELD

This invention relates to a potassium titanium phosphate glass and certain analogues thereof and to the use of such glass in a hydrothermal process for producing large, optically useful crystals of $KTiOPO_4$ and certain crystal analogues thereof.

BACKGROUND INFORMATION

The use of single crystals of $MTiOXO_4$, wherein M is at least one of K, Rb, Tl and $NH_4$, X is at least one of P and As when M is K, Rb or Tl and X is P when M is $NH_4$, in nonlinear optical devices is disclosed in U.S. Pat. No. 3,949,323. Patentees therein disclose the preparation of such crystals by hydrothermal methods. For most optical applications optical-quality crystals having dimensions of the order of one millimeter or more are generally required.

R. Masse and J. C. Grenier, Bull. Soc. Fr. Mineral Cristallogr. 94, 437–439 (1971) disclose the preparation of powders of $KTiOPO_4$ (and the analogues $RbTiOPO_4$ and $TlTiOPO_4$) by heating $KPO_3$ and $TiO_2$ at 900°–1200° C., and then cooling the melt at a rate of about 80° C. per hour. Crystalline masses are separated out with the aid of water, which presumably dissolves undesired materials. The ratio of $KPO_3/TiO_2$ in the reaction mixture was varied over the range from 4 to 1.0 and the product included two crystalline phases, $KTiOPO_4$ and $KTi_2(PO_4)_3$.

Gmelins Handbuch, System No. 41, Ti 405, 8th edition (1951), discloses that L. Ouvrard (Comptes rendus 111, 177–179 (1890)) formed $KTiOPO_4$ by melting hydrated $TiO_2$ with $K_4P_2O_7$ or $K_3PO_4$.

Seed crystals are often used in hydrothermal crystal-growth processes to provide nucleation sites. Such processes usually use a high pressure container in which single crystal seeds of the desired material are hung in a cool zone and a large quantity of polycrystalline nutrient of the same material is maintained in a warmer zone, all together with an aqueous solution of a mineralizer in which the nutrient is soluble to a significant extent. When heated under pressure, the nutrient dissolves in the warmer zone, is transported to the cooler zone via convection or concentration gradients and is deposited on the seed crystals. Large crystals are thereby produced. A common problem in such processes is the tendency of the seed crystals to dissolve in the aqueous solution before nutrient can migrate to the seed crystals.

BRIEF DESCRIPTION OF DRAWINGS

FIGS. 1 and 2 include ternary diagrams which depict the glass and the preferred glass of the invention.

DISCLOSURE OF INVENTION

For further comprehension of the invention, and of the objects and advantages thereof, reference may be made to the following description and accompanying drawings, and to the appended claims in which the various novel features of the invention are more particularly set forth.

The invention resides in the stable glass whose composition is defined by the quadrilaterals I II III IV of the accompanying ternary diagrams of FIGS. 1 and 2 for the system selected from the group consisting of $K_2O/P_2O_5/(TiO_2)_2$, $Rb_2O/P_2O_5/(TiO_2)_2$, $K_2O/As_2O_5/(TiO_2)_2$ and $Rb_2O/As_2O_5/(TiO_2)_2$. The invention also resides in the use of such glass in hydrothermal processes for producing crystals of $KTiOPO_4$ and certain crystal analogues thereof, namely, $RbTiOPO_4$, $KTiOAsO_4$ and $RbTiOAsO_4$. As an example of such use in a hydrothermal process, glasses formed from appropriate amounts of $KTiOPO_4$ and potassium phosphates, or their precursors, dissolve at least partially in water, providing solutions which may contain up to 60 weight % of dissolved solids. Such an aqueous solution, supersaturated with $KTiOPO_4$ or precursors thereof, can be used as the mineralizing fluid for hydrothermal crystal growth of $KTiOPO_4$ to minimize or eliminate the seed loss which may occur in commonly used hydrothermal processes for growing crystals.

More particularly, for the aforesaid systems $K_2O/P_2O_5/(TiO_2)_2$ and $Rb_2O/P_2O_5/(TiO_2)_2$, as shown in the ternary diagram of FIG. 1, the composition of the glass of the invention is within the quadrilateral I II III IV which is defined, in mole percentages, by the following:

|  | $K_2O$ or $Rb_2O$ | $P_2O_5$ | $(TiO_2)_2$ |
|---|---|---|---|
| I | 35 | 64.9 | 0.1 |
| II | 71.9 | 28 | 0.1 |
| III | 50 | 20 | 30 |
| IV | 35 | 35 | 30. |

The composition of the preferred glass of these systems, as shown in FIG. 1, is within the polygon ABCDEFG which is defined, in mole percentages, by the following:

|  | $K_2O$ | $P_2O_5$ | $(TiO_2)_2$ |
|---|---|---|---|
| A | 44 | 55 | 1 |
| B | 70 | 29 | 1 |
| C | 64 | 26 | 10 |
| D | 56 | 27 | 17 |
| E | 51 | 31 | 18 |
| F | 45 | 38 | 17 |
| G | 42 | 48 | 10. |

For the system $K_2O/P_2O_5/(TiO_2)_2$ a particularly preferred glass is one wherein the K/P mole ratio is about 0.8–2.5 and one wherein the glass is of the composition 55–60 mole % $K_2O$, 38–42 mole % $P_2O_5$ and 1–5 mole % $(TiO_2)_2$, with the total being 100 mole %. These preferred glasses are also preferred in the hydrothermal crystal growth processes which will be described subsequently in this specification.

For the aforesaid systems $K_2O/As_2O_5/(TiO_2)_2$ and $Rb_2O/As_2O_5/(TiO_2)_2$, as shown in the ternary diagram of FIG. 2, the composition of the glass of the invention is within the quadrilateral I II III IV which is defined, in mole percentages, by the following:

|  | $K_2O$ or $Rb_2O$ | $As_2O_5$ | $(TiO_2)_2$ |
|---|---|---|---|
| I | 35 | 64.9 | 0.1 |
| II | 74.9 | 25 | 0.1 |
| III | 45 | 25 | 30 |

-continued

|     | K₂O or Rb₂O | As₂O₅ | (TiO₂)₂ |
| --- | --- | --- | --- |
| IV  | 25 | 45 | 30. |

The composition of the preferred glass of these systems, as shown in FIG. 2, is within the quadrilateral ABCD which is defined, in mole percentages, by the following:

|   | K₂O or Rb₂O | As₂O₅ | (TiO₂)₂ |
| --- | --- | --- | --- |
| A | 39 | 60 | 1 |
| B | 67 | 32 | 1 |
| C | 51 | 32 | 17 |
| D | 35 | 48 | 17. |

The preferred glass in any of the aforesaid systems is clear and transparent. Moreover, as already suggested above, a unique feature of the glass of this invention is that it can be dissolved, at least partially, in water and the aqueous solution or sol thus produced can be used, in part or in toto, as the mineralizing fluid in a hydrothermal process for preparing crystals of $KTiOPO_4$ and the aforesaid crystal analogues thereof. When the preferred glass of this invention is used, clear aqueous solutions containing up to 60 weight % of the glass can be prepared.

The glass of the invention can be formed by heating to about 700°–1150° C., for a time sufficient to provide a substantially clear melt, a mixture of the appropriate aforesaid oxides of potassium or rubidium, phosphorus or arsenic and titanium, or suitable precursors thereof, in such amounts as is consistent with FIGS. 1 and 2 and so as to provide in the mixture, for the potassium or rubidium titanium phosphate glass, a (K or Rb)/P mole ratio of about 0.5 to 2.5, preferably about 0.8 to 2.5, and for the potassium or rubidium titanium arsenate glass, a (K or Rb)/As mole ratio of about 0.5 to 3.0, preferably about 0.7 to 2.0. Included as examples of suitable precursors which can be used in the preparation of the $K_2O/P_2O_5/(TiO_2)_2$ glass of this invention are $KTiOPO_4$, $TiO_2$, $KH_2PO_4$, $K_2HPO_4$, $K_3PO_4$, $KHCO_3$ and $NH_4H_2PO_4$, and hydrates thereof which lose their water content under the conditions of glass formation. For a composition in the preferred region of FIG. 1, $KTiOPO_4$ can be dissolved in molten potassium phosphates at levels up to 50 weight % (21 weight % $TiO_2$). Other suitable precursors, such as $H_3PO_4$, will be obvious to one skilled in the art, as will suitable analogues of the above precursors, such as $KH_2AsO_4$, $RbH_2AsO_4$ and $Rb_2CO_3$, for preparing the arsenic- and the rubidium-containing glass of this invention.

Once formed, the aforesaid melt can be quenched to the solid state, for example, by pouring the melt onto an aluminum plate. This results in a quench from an initial temperature of 700°–1150° C., such as about 1000° C., to below 500° C. in less than 10 seconds. The glass, in solid form, can be recovered and handled employing means common in the art.

As already indicated above, a clear aqueous solution containing up to 60 weight % of the preferred glass of the invention can be produced. Clear aqueous solutions containing up to 50 weight % of the preferred glass are stable for periods of days. At lower concentrations of glass, longer periods of stability can be achieved. For example, clear aqueous solutions containing 10 weight % of the preferred glass are stable for from weeks to months. It is to be understood, however, that the aforesaid sol (containing partially dissolved glass) and solution (containing completely dissolved glass) are metastable since the amount of $TiO_2$, expressed as $KTiOPO_4$, dissolved therein greatly exceeds the equilibrium solubility value of $TiO_2$ (about 0.001 weight %). As a result, gellation of the sol or solution can be induced, for example, by heating to 50°–100° C. for 1 to 24 hours or by adding an acid or a base. Hydrothermal treatment, that is, for example, heating to 600°–700° C. at 3000 atmospheres (0.3 GPa) of pressure, gives, successively, gellation, spontaneous nucleation and crystal growth.

As already indicated above, the glass of this invention is useful in hydrothermal processes for preparing crystals of $KTiOPO_4$ and its aforesaid crystal analogues, particularly such crystals which have utility in optical devices. In general, in order to grow large single crystals in a hydrothermal process, seed crystals are employed. In some instances the seed crystals may dissolve in the mineralizing solution before the nutrient in the solution can reach the seeds and initiate growth. This problem can be minimized or avoided entirely by means of this invention. In effect, the sol or solution provides a supersaturated environment of the requisite components of the desired crystal. As already indicated, the sol or solution can comprise part or all of the mineralizing solution which is used in the hydrothermal process.

The following description demonstrates the use of the glass of this invention in a hydrothermal process for preparing $KTiOPO_4$ crystals. Although the discussion is limited to the preparation of $KTiOPO_4$ crystals, it will be obvious to one skilled in the art how similar procedures can be employed to prepare the aforesaid crystal analogues of the $KTiOPO_4$, namely, $RbTiOPO_4$, $KTiOAsO_4$ and $RbTiOAsO_4$.

A gold tree with one or more $KTiOPO_4$ seed crystals hanging from the upper end is placed in a gold tube sealed at one end. The tube is then charged with water and a mineralizer comprised of the $K_2O/P_2O_5/(TiO_2)_2$ glass of this invention and, depending upon the composition of the glass, additional potassium phosphates. Nutrient crystals of $KTiOPO_4$ are placed at the bottom of the tube and held there by a gold gauze. The tube is sealed and held in a vertical position under a pressure of 3000 atmospheres (0.3 GPa), with the temperature of the bottom nutrient zone (500°–700° C., preferably about 600° C.) being maintained 10°–100° C. higher than that of the top crystallizing zone. Heating times are determined by the volume of new crystal growth desired and typically range from 2 to 20 days or longer, after which the tube is quenched to room temperature and opened and the crystals are recovered.

The total amounts of starting materials introduced into the gold tube are determined by the volume of the tube. When $KTiOPO_4$ crystals are to be grown, for example, the relative amounts of starting materials are chosen so as to be consistent with the following guidelines:

(1) the ratio of K to P in the total glass-potassium phosphate charge (excluding $KTiOPO_4$ present and the amount of potassium phosphate necessary to combine with any $TiO_2$ present to form $KTiOPO_4$) is 1.1–1.7, preferably 1.5;

(2) the amount of $KTiOPO_4$ in solution in the glass is 2–10 mole % of the total molar amounts of the aqueous mineralizer components; and (3) the phosphate molality in the aqueous mineralizing fluid is 4–20 molal, preferably 10–15 molal.

It is to be understood and it will be obvious to one skilled in the art that the glass of this invention provides a means for obtaining supersaturated solutions of KTiOPO$_4$ and its analogous (or their precursors) for purposes other than hydrothermal crystal growth.

INDUSTRIAL APPLICABILITY

The following experiment demonstrates the industrial applicability of this invention.

A gold tube, ⅝" OD×6" long (1.59 cm OD×15.24 cm long) was sealed at one end and charged with, in the following order: a gold tree with two KTiOPO$_4$ seed crystals hanging from the upper end; 7 cc of water; 6.0 g of a water soluble glass containing 1.434 g of KTiOPO$_4$ dissolved in 4.566 g of a potassium phosphate melt in which the K/P ratio is 1.5; a mineralizer mixture of 11.40 g of K$_2$HPO$_4$.3H$_2$O and 6.80 g of KH$_2$PO$_4$; and 7.0 g of KTiOPO$_4$ nutrient crystals, retained by a gold gauze, at the bottom. The tube was sealed and run in a vertical position under a pressure of 3000 atmospheres (0.3 GPa), with the temperatures of the bottom nutrient zone being held at 630° C. and the temperature of the top crystallizing zone being held at 550° C. for three days, at which time the tube was quenched to room temperature in about 10 minutes and opened. The two KTiOPO$_4$ seed crystals had average increases in length of 4.7 mm, in width of 1.1 mm, in thickness of 3.0 mm and in weight of 2.0 g. The 011 surfaces were quite smooth and only a few cracks, which had been present in the original seeds, were visible.

EXAMPLE 1

A glass of the invention, corresponding to 56.73 mole percent K$_2$O, 39.19 mole percent P$_2$O$_5$ and 4.08 mole percent (TiO$_2$)$_2$, was prepared by ball milling 48.0 g of KTiOPO$_4$ powder, 141.88 g of KH$_2$PO$_4$ and 181.20 g of K$_2$HPO$_4$. The milled mixture was prefused to drive off water, recovered, reground and remelted at 1000° C. to a clear syrup. Quenching the syrup onto an aluminum plate gave a clear colorless glass which was then crushed and stored. The glass was soluble in water in concentrations of up to at least 56% glass by weight, to give a clear solution with only a trace of suspended material. The solution set to a gel after heating at 70° C. for 3 days.

EXAMPLE 2

A glass of this invention, corresponding to 58.0 mole percent K$_2$O, 39.5 mole percent P$_2$O$_5$ and 2.5 mole percent (TiO$_2$)$_2$, was prepared by mixing together 8.0 g of TiO$_2$, 115.6 g of KH$_2$PO$_4$ and 130.5 g of K$_2$HPO$_4$ in a platinum dish, prefusing at about 400°–500° C. to drive off water and melting at 950°–1000° C. to a clear melt. Quenching the melt onto an aluminum plate, to cool it quickly, gave a clear glass which was broken into small fragments and stored. The glass was completely soluble in water to at least a 60% by weight level at room temperature. Dilute aqueous solutions (10% by weight) were stable for prolonged periods (at least 30 days), but gelled spontaneously on warming or on addition of small quantities of KOH or H$_3$PO$_4$.

EXAMPLES 3–6 AND EXPERIMENTS 1–2

Glasses of this invention were prepared in accordance with the procedure of Example 1. The starting materials and the amounts thereof, in grams, are shown in the following table. The clear glasses of Examples 3–5 are completely water soluble; the glass of Example 6, although incompletely soluble, gives a solution containing a substantial quantity of TiO$_2$. Experiments 1 and 2 were carried out in a similar fashion (to Examples 3–6) except that the amounts of the starting materials were such that the final compositions were outside that of the glass of the invention. Both compositions were substantially solid at 1100° C. and could not be quenched to a glass. The product from Experiment 1 was insoluble in water; the product from Experiment 2 was mostly soluble, but all of the titanium values remained in the insoluble portion. Neither composition is suitable for use in the growth of KTiOPO$_4$ crystals.

|         | (TiO$_2$)$_2$ | KH$_2$PO$_4$ | K$_2$HPO$_4$ | NH$_4$H$_2$PO$_4$ |
|---------|---------|---------|---------|---------|
| Ex. 3   | 8.07    | —       | 33.41   | 0.38    |
| Ex. 4   | 40.35   | 116.74  | 61.48   | —       |
| Ex. 5   | 8.00    | 58.48   | —       | 4.60    |
| Ex. 6   | 60.53   | 103.02  | 105.46  | —       |
| Expt. 1 | 20.18   | 70.32   | —       | 30.42   |
| Expt. 2 | 0.81    | —       | 18.17   | 8.42 (KHCO$_3$) |

EXAMPLE 7

A glass of the invention, corresponding to 46.55 mole percent K$_2$O, 46.55 mole percent As$_2$O$_5$ and 6.9 mole percent (TiO$_2$)$_2$, was prepared by ball milling 1.6 g of TiO$_2$ and 24.3 g of KH$_2$AsO$_4$. This mixture was melted easily at about 1000° C. to a clear syrup. Quenching the syrup onto an aluminum plate gave a clear colorless glass. The glass rapidly hydrolyzed to a white amorphous powder at the 20 weight % concentration level in water. This glass would be useful in preventing KTiOAsO$_4$ seed dissolution in a conventional hydrothermal growth process since the amorphous powder is more soluble in the aqueous growth medium than the seeds.

EXAMPLE 8

A glass of the invention, corresponding to 54 mole percent Rb$_2$O, 36 mole percent P$_2$O$_5$ and 10 mole percent (TiO$_2$)$_2$, was prepared by ball milling 1.6 g of TiO$_2$, 13.14 g of H$_3$PO$_4$ and 4.16 g of Rb$_2$CO$_3$. This mixture was melted easily at about 1000° C. to a clear syrup. Quenching the syrup onto an aluminum plate gave a clear colorless glass. The glass easily formed a stable 40 weight % solution in water. This glass would be useful in preventing RbTiOPO$_4$ seed dissolution in a conventional hydrothermal growth process.

EXAMPLE 9

A glass of the invention, corresponding to 46.55 mole percent Rb$_2$O, 46.55 mole percent As$_2$O$_5$ and 6.9 mole percent (TiO$_2$)$_2$, was prepared by ball milling 1.6 g of TiO$_2$ and 30.59 g of RbH$_2$AsO$_4$. This mixture was melted easily at about 1000° C. to a clear syrup. Quenching the syrup onto an aluminum plate gave a clear colorless glass. The glass rapidly hydrolyzed to a white amorphous powder at the 20 weight % concentration level in water. This glass would be useful in preventing RbTiOAsO$_4$ seed dissolution in a conventional hydrothermal growth process since the amorphous powder is more soluble in the aqueous growth medium than the seeds.

BEST MODE FOR CARRYING OUT THE INVENTION

The best mode for carrying out the invention is shown in Examples 1 and 2.

I claim:

1. Improved hydrothermal process for growing a crystal of $KTiOPO_4$, $RbTiOPO_4$, $KTiOAsO_4$ or $RbTiOAsO_4$ by employing in the process at least one seed growth crystal thereof, an aqueous mineralizer solution and $KTiOPO_4$, $RbTiOPO_4$, $KTiOAsO_4$ or $RbTiOAsO_4$ growth nutrient, the improvement characterized in that the mineralizer is comprised, at least in part, of the stable glass whose composition is defined by the quadrilaterals I II III IV of the ternary diagrams of FIGS. 1 and 2, said glass being of the system, corresponding to the aforesaid crystal, $K_2O/P_2O_5/(TiO_2)_2$, $Rb_2O/P_2O_5/(TiO_2)_2$, $K_2O/As_2O_5/(TiO_2)_2$ or $Rb_2O/As_2O_5/(TiO_2)_2$.

2. Process of claim 1 wherein the crystal being grown is $KTiOPO_4$, the growth nutrient is $KTiOPO_4$ and the glass is of the system $K_2O/P_2O_5/(TiO_2)_2$ and is defined by the quadrilateral I II III IV of the ternary diagram of FIG. 1.

3. Process of claim 2 wherein the glass is of the composition defined by the polygon ABCDEFG of FIG. 1.

4. Process of claim 3 wherein the glass is of the composition 55–60 mole % $K_2O$, 38–42 mole % $P_2O_5$ and 1–5 mole % $(TiO_2)_2$, with the total thereof being 100 mole %.

5. Process of claim 3 wherein the K/P mole ratio in the glass is about 0.8–2.5.

6. Process of claim 1 wherein the crystal being grown is $RbTiOPO_4$, the growth nutrient is $RbTiOPO_4$ and the glass is of the system $Rb_2O/P_2O_5/(TiO_2)_2$ and is defined by the quadrilateral I II III IV of the ternary diagram of FIG. 1.

7. Process of claim 1 wherein the crystal being grown is $KTiOAsO_4$, the growth nutrient is $KTiOAsO_4$ and the glass is of the system $K_2O/As_2O_5/(TiO_2)_2$ and is defined by the quadrilateral I II III IV of FIG. 2.

8. Process of claim 1 wherein the crystal being grown is $RbTiOAsO_4$, the growth nutrient is $RbTiOAsO_4$ and the glass is of the system $Rb_2O/As_2O_5/(TiO_2)_2$ and is defined by the quadrilateral I II III IV of FIG. 2.

* * * * *